(12) United States Patent
Baines et al.

(10) Patent No.: US 10,283,499 B2
(45) Date of Patent: May 7, 2019

(54) HETEROJUNCTION DIODE HAVING AN INCREASED NON-REPETITIVE SURGE CURRENT

(71) Applicant: COMMISSARIAT A L'ENERGIE ATOMIQUE ET AUX ENERGIES ALTERNATIVES, Paris (FR)

(72) Inventors: Yannick Baines, Grenoble (FR); Julien Buckley, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/776,632

(22) PCT Filed: Nov. 17, 2016

(86) PCT No.: PCT/FR2016/052997
§ 371 (c)(1),
(2) Date: May 16, 2018

(87) PCT Pub. No.: WO2017/085413
PCT Pub. Date: May 26, 2017

(65) Prior Publication Data
US 2018/0374848 A1 Dec. 27, 2018

(30) Foreign Application Priority Data
Nov. 17, 2015 (FR) ...................... 15 61049

(51) Int. Cl.
*H01L 27/08* (2006.01)
*H01L 29/66* (2006.01)
(Continued)

(52) U.S. Cl.
CPC ...... *H01L 27/0814* (2013.01); *H01L 21/8252* (2013.01); *H01L 23/3171* (2013.01);
(Continued)

(58) Field of Classification Search
CPC .................................................. H01L 27/0814
See application file for complete search history.

(56) References Cited

U.S. PATENT DOCUMENTS

| 2013/0105815 A1 | 5/2013 | Shibata |
| 2014/0231873 A1 | 8/2014 | Shibata et al. |

(Continued)

FOREIGN PATENT DOCUMENTS

| JP | 2012-28409 A | 2/2012 |
| JP | 2015-198175 A | 11/2015 |

OTHER PUBLICATIONS

Li, Z. et al., "*A New Method to Modify Two-Dimensional Electron Gas Density by GaN Cap Etching*", Japanese Journal of Applied Physics 52 (2013) 08JN11, published online at iopscience.iop.org, May 20, 2013, 4 pages.
(Continued)

*Primary Examiner* — Asok K Sarkar
*Assistant Examiner* — Grant S Withers
(74) *Attorney, Agent, or Firm* — Oblon, McClelland, Maier & Neustadt, L.L.P.

(57) ABSTRACT

A heterojunction diode is provided, including first and second semiconductor layers made of III-N material, the layers being superposed to form a two-dimensional electron gas; an anode and a cathode that are selectively electrically connected to each other by the electron gas; a third semiconductor layer positioned under the gas; a p-doped first semiconductor element contacting the anode the third layer, and forming a separation between the anode and the third layer; and an n-doped second semiconductor element contacting the cathode and the third layer, and forming a separation between the cathode and the third layer, the third layer and the first and second elements forming a p-i-n diode.

13 Claims, 8 Drawing Sheets

(51) Int. Cl.
   *H01L 29/861*   (2006.01)
   *H01L 29/872*   (2006.01)
   *H01L 29/20*    (2006.01)
   *H01L 29/205*   (2006.01)
   *H01L 21/8252*  (2006.01)
   *H01L 23/31*    (2006.01)
   *H01L 29/08*    (2006.01)
   *H01L 29/417*   (2006.01)
   *H01L 29/868*   (2006.01)
   *H01L 29/40*    (2006.01)

(52) U.S. Cl.
   CPC .......... *H01L 29/08* (2013.01); *H01L 29/2003* (2013.01); *H01L 29/205* (2013.01); *H01L 29/417* (2013.01); *H01L 29/66212* (2013.01); *H01L 29/66219* (2013.01); *H01L 29/861* (2013.01); *H01L 29/868* (2013.01); *H01L 29/872* (2013.01); *H01L 29/402* (2013.01)

(56) References Cited

U.S. PATENT DOCUMENTS

2015/0069410 A1    3/2015  Umeno et al.
2017/0330944 A1*  11/2017  Baines ................ H01L 29/0649

OTHER PUBLICATIONS

Kambayashi, H. et al., "Over 100 a operation normally-off AlGaN/GaN hybrid MOS-HFET on Si substrate with high-breakdown voltage", Solid-State Electronics 54 (2010), Elsevier Ltd., pp. 660-664.

Li, Z. et al., "High Voltage Normally-off GaN MOSC-HEMTs on Silicon Substrates for Power Switching Applications", IEEE, International Symposium on Power Semiconductor Devices and ICs, Jun. 2012, pp. 45-48.

International Search Report dated Feb. 14, 2017 in PCT/FR2016/052997, filed on Nov. 17, 2016.

* cited by examiner

HETEROJUNCTION DIODE HAVING AN INCREASED NON-REPETITIVE SURGE CURRENT

The invention relates to heterojunction diodes, and in particular to power diodes having to support a substantially increased transient surge current.

III-N type heterojunction diodes are increasingly used for power applications in order to respond to significant constraints in terms of electric power consumption, voltages and operating currents.

Patent US 2014/231873 discloses a heterojunction diode. This heterojunction diode comprises a superposition of a GaN layer and an AlGaN layer. An electron gas layer is formed at the interface between the AlGaN layer and the GaN layer as a result of spontaneous biasing and piezoelectric biasing. The electron gas layer acts as a channel for the diode and permits a very high density current with very low conduction resistance. Such a diode also has a very low threshold voltage, allowing electric power consumption to be reduced when it is directly biased.

A Schottky contact is formed on the AlGaN layer to form an anode. An ohmic contact is formed through the AlGaN layer and is in contact both with the AlGaN layer and the GaN layer to form a cathode. A passivation layer made of SiN is formed on the AlGaN layer between the anode and the cathode. A P-doped GaN layer is formed on the AlGaN layer. It is shaped so that it is laterally delimited by the anode and the passivation layer and it is covered by the anode and the passivation layer. This GaN layer is intended to reduce the leakage currents between the anode and the cathode in the off-state, such leakage currents can occur at the interface between the passivation layer and the AlGaN layer.

The power diodes particularly have to handle a non-repetitive surge current specification, denoted using the acronym IFSM, without degrading performance. This value preferably must be approximately ten times the rating of the forward current of the diode. The electron gas layer has limitations in terms of maximum supported current, limiting the amplitude of the IFSM current relative to the rating.

Therefore, a requirement exists for a power diode having a relatively high IFSM surge current relative to its rating and for which the structure is relatively easy to produce.

Document JP 2015 198175, with reference to FIG. 7 thereof, discloses a heterojunction diode comprising:
- a first semi-conductive layer 31 made of GaN;
- a second semi-conductive layer 14 made of AlGaN superposed on the first layer to form an electron gas A;
- an anode 35A and a cathode 35C selectively connected to each other by means of the electron gas layer;
- a third semi-conductive layer 31 positioned under the electron gas layer and under the first semi-conductive layer 31;
- a first P-doped semi-conductor element 33 in contact with the anode 35A;
- a second N-doped semi-conductor element 34 in contact with the cathode 35C and forming a separation between the cathode 35C and the third layer 31;
- the third semi-conductive layer 31, the second semi-conductor element 34 and part of the first semi-conductive layer 32 interposed between the first semi-conductor element 33 and the third semi-conductive layer 31 forming a PIN diode.

Such a diode has disadvantages. In order to increase the current in the on-state, the document uses a high concentration of dopants in the third semi-conductive layer 31, to the detriment of the breakdown voltage resistance between the anode and the cathode. For high voltages, in practice this means that the thickness of the part of the first semi-conductive layer 32 that is interposed between the semiconductor element 33 and the semi-conductive layer 31 is substantial.

Document JP 2012 028409 discloses:
a heterojunction diode comprising:
- a first layer made of GaN;
- a second layer made of AlGaN superposed on the first layer to form an electron gas;
- an anode and a cathode selectively connected to each other by means of the electron gas layer;
- a first P-doped semi-conductor element in contact with the anode;
- a second N-doped semi-conductor element in contact with the cathode;
- a subjacent PIN diode formed with the semi-conductor elements.

The aim of the invention is to overcome one or more of these disadvantages. Therefore, the invention relates to a heterojunction diode as defined in appended claim 1.

The invention further relates to the variations defined in the appended dependent claims. A person skilled in the art will understand that each of the features of these variations can be combined independently of the features of claim 1, without as such forming an intermediate generalization.

The invention further relates to a method for manufacturing a heterojunction diode as defined in the appended claims.

Further features and advantages of the invention will become clearly apparent from the following description, by way of a non-limiting example, with reference to the accompanying drawings, in which.

The invention proposes forming a PIN diode under a heterojunction diode, between the anode and the cathode of this heterojunction diode. The structure that is thus obtained both affords the benefit of a high current density for the heterojunction diode in the on-state and allows additional conduction by the PIN diode in the event of a transient surge.

Figure 1:
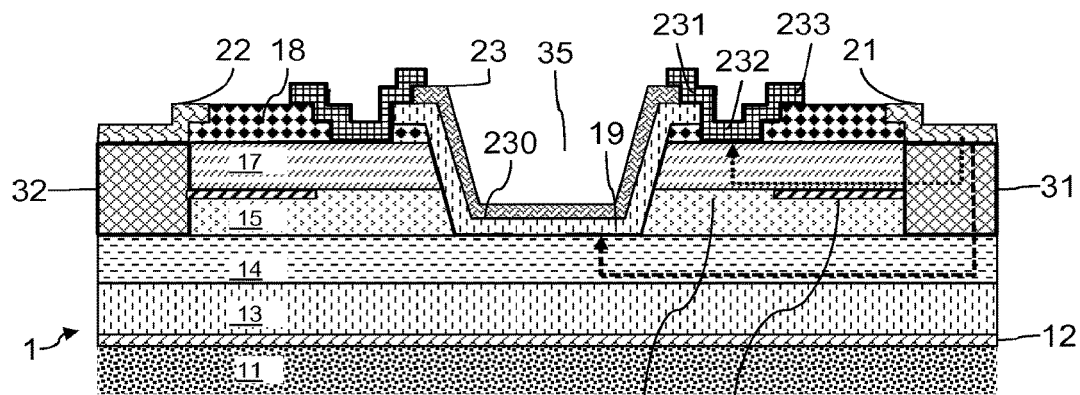
FIG. 1 is a schematic section view of an example of a heterojunction diode structure according to a first embodiment of the invention.

FIG. 1 is a section view of an integrated circuit including a diode structure 1 according to an example of a first embodiment of the invention. In the example shown, two heterojunction diodes are formed with a common anode. The diode structure 1 comprises:
- a substrate 11. The substrate 11 can be an insulator or an intrinsic or doped silicon type semi-conductor. The substrate 11 can be of the mesh orientation silicon type (111), for example. The substrate 11 also particularly can be made of silicon carbide or of sapphire. The substrate 11 can be approximately 650 µm thick, typically included in a range of 400 µm and 2 mm;

possibly an adaptation layer 12 disposed on the substrate 11. The adaptation layer 12, which is deposited on the substrate 11 in a manner per se known, acts as an intermediary between this substrate and the semi-conductive layer 13 described hereafter, or another semi-conductive layer in the absence of the layer 13. The adaptation layer 12 allows a mesh adaptation between the substrate 11 and this semi-conductive layer 13. The adaptation layer 12 typically can be made of aluminum nitride for a semi-conductive layer 13 made of GaN;

possibly a semi-conductive buffer layer 13 (for example, of the III-V type, for example, made of group III element nitride, typically of unintentionally doped GaN), which in this case is disposed on the adaptation layer 12. An unintentionally doped semi-conductor normally denotes a semi-conductor in which impurities have not been introduced intentionally. Such a semi-conductor typically has an impurities concentration that is at most equal to $10^{15}$ cm$^{-3}$. Doped GaN also can be used that includes high concentrations of carbon (for example, greater than $10^{18}$ cm$^{-3}$ with a view to increasing the electric insulation properties of this layer);

a semi-conductive layer 14 (made of GaN, which is the particular case of III-N type material) with reduced doping. The layer 14 in this case is formed on the semi-conductive buffer layer 13. The layer 14 is N-doped with a concentration that is at most equal to $4*10^{16}$ cm$^{-3}$, with this concentration advantageously being at least equal to $5*10^{15}$ cm$^{-3}$. The semi-conductive layer 14 typically is at least 100 nm thick, preferably at least 150 nm thick;

an unintentionally doped semi-conductive layer 15 made of GaN. The semi-conductive layer 15 in this case is formed on the semi-conductive layer 14. The semi-conductive layer 15 typically is 100 nm thick;

a semi-conductive layer 17 made of III-N material (for example, a III-N type ternary alloy, for example, AlGaN, in particular AlGaN having a molar fraction of aluminum included in a range of 20% and 30%). The semi-conductive layer 17 in this case is formed on the semi-conductive layer 15. The semi-conductive layer comprises a higher forbidden band than that of the semi-conductive layer 15 made of AlGaN, InAlN or AlN, for example. The semi-conductive layer 17 typically is 25 nm thick, included in a range of 10 and 40 nm, for example. The semi-conductive layers 15 and 17 are superposed in a manner per se known to form an electron gas layer 16 at the interface or in the vicinity of the interface between these layers 15 and 17. The electron gas layer 16 is thus formed above the semi-conductive layer 14;

a P-doped semi-conductor element 19 (for example, a III-N type alloy, for example, GaN or AlGaN, or polysilicon). The concentration of P-dopants in this semi-conductor element 19 advantageously is included in a range of $5*10^{17}$ cm$^{-3}$ and $10^{20}$ cm$^{-3}$. The highest concentrations of P-dopant in particular can be obtained for a semi-conductor element 19 made of polysilicon. The semi-conductor element 19 is in contact with the layer 14;

semi-conductor elements 31 and 32 disposed either side of the semi-conductor element 19 at a distance from this semi-conductor element 19. The semi-conductor elements 31 and 32 are N-doped. The concentration of N-dopants of the semi-conductor elements 31 and 32 advantageously is included in a range of $5*10^{17}$ cm$^{-3}$ and $10^{20}$ cm$^{-3}$. The semi-conductor elements 31 and 32 are in contact with the layer 14. The semi-conductor elements 31 and 32 are formed, for example, by implanting N-dopant in the layers 15 and 17 made of silicon, for example. The elements 31 and 32 also can be made of N-doped polysilicon. The highest concentrations of N-dopant in particular can be obtained for semi-conductor elements 31 and 32 made of polysilicon;

a metal anode 23 in contact with the semi-conductor element 19. The semi-conductor element 19 forms a separation between the layer 14 and the anode 23. In the example, the metal anode 23 covers the semi-conductor element 19. The metal anode 23 comprises a central portion 230 covering the semi-conductor element 19. The anode 23 has a laterally projecting portion 231. The portion 231 is projecting relative to the semi-conductor element 19 toward the cathode 21. The projecting portion 231 passes through the passivation layer 18 and forms a Schottky contact 232 with the layer 17. The projecting portion 231 has an extension 233 toward the anode 21, beyond the Schottky contact 232, overhanging the passivation layer 18.

The central portion 230 and the projecting portion 231 of the anode 23 can be made of two different materials. The portion 231 is configured to form a Schottky contact with the layer 17, the central portion preferably forming an ohmic contact at the interface with the semi-conductor element 19. The materials for the central portion 230 and/or for the projecting portion 231 are selected from nickel, palladium, gold, TiN, platinum or a superposition of layers of at least two of these materials, for example. If a high work function is desired for part of the anode 23, the selection of nickel allows a good compromise to be obtained between its cost and the level of the work function that it is able to obtain. For a P-doped semi-conductor element 19 made of GaN, a central portion 230 of the anode 23 with a high work function is sought, for example. For a P-doped semi-conductor element 19 made of polysilicon, a central portion 230 of the anode 23 can be used with a lower work function, obtained by silicidation and TiN deposition, for example;

metal cathodes 21 and 22, respectively in contact with the semi-conductor elements 31 and 32. The metal cathodes 21 and 22 form ohmic contacts with the semi-conductor elements 31 and 32, respectively. The semi-conductor elements 31 and 32 form a separation between the layer 14 and the cathodes 21 and 22, respectively. The cathodes 21 and 22 are disposed either side of the anode 23 at a distance from this anode 23. The cathodes 21 and 22 are intended, in a manner per se known, to be selectively connected to the anode 23 by means of the electron gas layer 16, as a function of the potentials that are applied thereto. The metal cathodes 21 and 22 can be formed, in a manner per se known, by aluminum and titanium, aluminum and tantalum multilayer films. In the example shown in FIG. 14 (applicable to all the embodiments), the metal cathodes 21 and 22 form an overlap on the layer 17;

advantageously, a passivation layer 18 (for example, made of silicon nitride, of SiO$_2$ or of Al$_2$O$_3$). This passivation layer 18 typically is at least 100 nm thick, produced with one or more superposed layers. The passivation layer 18 is formed on the semi-conductive layer 17. The passivation layer 18 forms a protection for the layer 17 and an electric insulation between the anode 23 and the cathodes 21 and 22.

Circuits, not shown, selectively apply electric biasing to the cathodes 21, 22 and to the anode 23. The dimensions of the various elements and layers are only shown schematically, their dimensions and structures can significantly differ from the illustration of FIG. 1.

Figure 3:
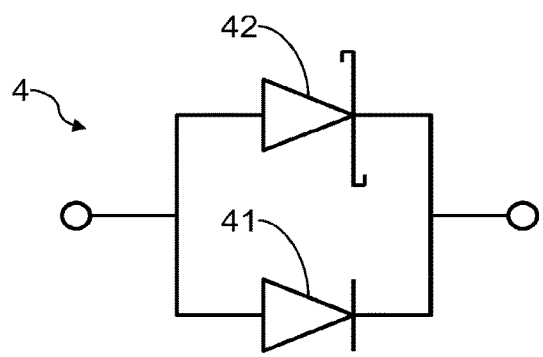
FIG. 3 is an electrical diagram equivalent to a diode structure according to the invention.

The diode structure 1 of FIG. 1 forms a circuit 4, schematically shown in FIG. 3, between the anode 23 and the cathode 21, on the one hand, and between the anode 23 and the cathode 22, on the other hand. The circuit 4 comprises a Schottky heterojunction diode 41, on the one hand, and a PIN diode 42, on the other hand, connected in parallel (common anodes and cathodes).

A heterojunction diode 41 is formed between the anode 23 and the cathode 21. In the absence of biasing on the anode 23 and on the cathode 21, the diode 41 that is formed is in the off-state. Indeed, the P-doped semi-conductor element 19 and the Schottky contact 232 generate a depleted zone 161 at the interface between the layers 15 and 17, in the vicinity of the element 19 and directly below the Schottky contact 232. The electron gas layer 16 is thus interrupted before arriving below the Schottky contact 232. An off-state heterojunction diode is thus formed between the Schottky contact 232 and the cathode 21, through the element 31, the electron gas layer 16 and the layers 15 and 17. With the application of a potential difference between the cathode 21 and the anode 23 that is greater than its threshold voltage, the electron gas layer 16 is reconstituted directly below the Schottky contact 232. The diode 41 that is formed is then in the on-state, with electric conduction through the element 31, the electron gas layer 16 and the layer 17, as shown by the dotted arrow schematically representing the current in the on-state. The on-state of the heterojunction diode 41 is obtained, in a manner per se known, with a relatively low potential difference between the anode 23 and the cathode 21 (for example, a threshold voltage of approximately 0.5 V), allowing the potential drop and losses to be limited in this diode 41 in the on-state.

A PIN diode 42 is formed between the anode 23 and the cathode 21. The P-doped zone of the PIN diode 42 is formed by the element 19. The N-doped zone of the PIN diode 42 is formed by the element 31. The zone, called intrinsic zone, of the PIN diode 42 is formed by the layer 14 (weakly n-doped) interposed between the elements 19 and 31. With the application of a suitable potential difference between the cathode 21 and the anode 23, this diode 42 is brought to the on-state. The PIN diode 42 then provides electric conduction by means of the element 19, the layer 14 and the element 31, as shown by the electron current represented by the dashed line arrow in FIG. 1. With a PIN diode ideally being bipolar, a hole current also exists in the opposite direction. The potential difference to be applied between the cathode 21 and the anode 23 is greater than the threshold voltage of the heterojunction diode 41. Thus, during a transient current surge, the PIN diode 42 that is formed provides a second conduction channel physically separated from that of the heterojunction diode 41. The diode structure 1 that is thus formed consequently allows a transient surge current to be obtained that is significantly greater than the nominal current of the heterojunction diode 41.

As previously described, the layer 14 made of GaN has a concentration of dopants at most equal to $4*10^{16}$ cm$^{-3}$. Such a concentration of dopants avoids a breakdown of this layer 14 almost independently of its length (anode-cathode length), for potential differences between the anode and the cathode of several hundred volts, typically up to 2,000 V. The concentration of dopants in the layer 14 is less than the concentration of dopants in the semi-conductor element 19 and the concentration of dopants in the semi-conductor elements 31 or 32. The layer 14 advantageously has a concentration of dopants at least equal to $5*10^{16}$ cm$^{-3}$, particularly if this layer 14 is made of GaN. Such a concentration of dopants allows electric conduction in the PIN diode 42 to be promoted when it is in the on-state.

In the example shown in FIG. 1, a channel 35 is arranged through the layers 15 and 17. The bottom of the channel 35 is delimited by the layer 14, with the lateral walls and the bottom of the channel 35 being covered by the semi-conductor element 19, so that the semi-conductor element 19 is in contact with the layer 14 in the bottom of the channel 35. The bottom of the element 19 is intended to form the P-doped zone of the PIN diode 42. The sides (optional) of the element 19 in contact with the walls of the channel 35 in this case are advantageously arranged to deplete part of the interface between the layers 15 and 17. In this case, the height of the sides of the element 19 is at least equal to the sum of the thicknesses of the layers 15, 17 and 18 (typically greater than 200 nm).

The width of the semi-conductor element 19 is designed as a function of the transient surge current intended to be conducted through the PIN diode 42 brought to the on-state. This width typically can be included in a range of 1 and 5 μm for a power diode structure 1. The width of the semi-conductor element 19 advantageously will be limited, in order to maintain a sufficient width for a projecting portion 231, with this projecting portion being intended to conduct the current of the heterojunction diode 41 in the on-state, during normal operation.

The anode 23 in this case comprises an extension 233 toward the cathode 21, beyond the Schottky contact 232. This extension 233 overhangs the passivation layer 18 and allows the range of the electric field applied by the anode 23 at the interface between the layers 15 and 17 to be increased, when the diode 41 is biased in the on-state. In order to reduce the risks of breakdown of the passivation layer 18, the thickness of the layer 18 advantageously increases under the extension 233 toward the cathode 21. The extension 233 and the subjacent layer 18 in this case are step-shaped toward the cathode 21. Such a configuration allows the risks of breakdown of the layer 18 to be limited for high voltages.

The width of the Schottky contact 232 is designed in a manner per se known to allow the passage of the nominal current of the diode 41 in the on-state.

Figure 2:
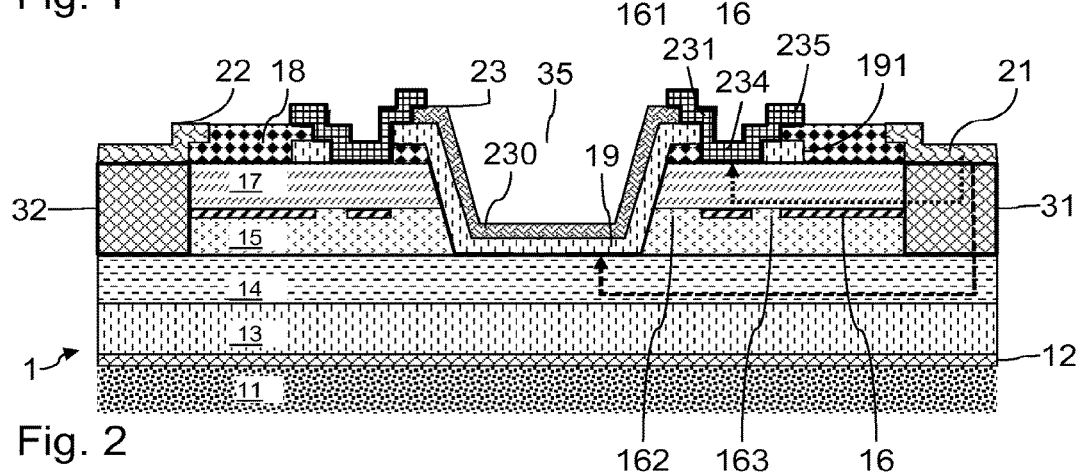
FIG. 2 is a schematic section view of an example of a heterojunction diode structure according to a second embodiment of the invention.

FIG. 2 is a section view of a diode structure 1 according to an example of a second embodiment of the invention. As with the structure of FIG. 1, two heterojunction diodes are formed with a common anode.

The diode structure 1 of FIG. 2 comprises the following elements, with a structure and a composition similar to that of the first embodiment and which therefore will not be described again:
  a substrate 11;
  an adaptation layer 12;
  a semi-conductive layer 13;
  a semi-conductive layer 14;
  a semi-conductive layer 15;
  a semi-conductive layer 17;
  an electron gas layer 16;
  a semi-conductor element 19;
  semi-conductor elements 31 and 32;
  cathodes 21 and 22;
  a channel 35 arranged through the layers 15 and 17.

In the second embodiment, the diode structure 1 also comprises an anode 23 in contact with the semi-conductor element 19. The anode 23 also covers the semi-conductor element 19. The metal anode 23 comprises a central portion 230 covering the semi-conductor element 19. The anode 23 also has a laterally projecting portion 231. The portion 231 projects relative to the semi-conductor element 19 toward the cathode 21. The projecting portion 231 passes through a passivation layer 18. The projecting portion 231 forms an ohmic or (preferably) Schottky contact 234 passing through the passivation layer to form a contact with the layer 17.

The central portion 230 and the projecting portion 231 of the anode 23 can be made of two different materials, as shown herein. The materials for the central portion 230 and/or the projecting portion 231 are selected, for example, from aluminum, titanium, nickel or from a superposition of layers of these materials. The previously described criteria for selecting materials for the central and projecting portions of the anode 23 are also applicable to this embodiment. The projecting portion 231 has an extension 235 toward the anode 21, beyond the ohmic contact 234. The extension 235 overhangs a P-doped semi-conductor element 191, typically made of the same material as the semi-conductor element 19. The semi-conductor element 191 in this case is positioned between the ohmic contact 234 and the cathode 21. The semi-conductor element 191 is in contact with the layer 17.

A heterojunction diode 41 (with reference to FIG. 3) in this case is also formed between the anode 23 and the cathode 21. In the absence of biasing on the anode 23 and on the cathode 21, the diode 41 that is formed is in the off-state. Indeed, the P-doped semi-conductor element 191 generates a depleted zone 163 at the interface between the layers 15 and 17, directly below this element 191. The electron gas layer 16 is thus interrupted before arriving below the ohmic contact 234. The P-doped semi-conductor element 19 also generates a depleted zone 162 at the interface between the layers 15 and 17. An off-state heterojunction diode is thus formed between the contact 234 and the cathode 21, through the element 31, the electron gas layer 16 and the layers 15 and 17. With the application of a potential difference between the cathode 21 and the anode 23 that is greater than its threshold voltage, the electron gas layer 16 is reconstituted directly below the semi-conductor element 191. The diode 41 that is formed is then in the on-state, with electric conduction through the element 31, the electron gas layer 16 and the layer 17, as shown by the dotted arrow schematically showing the current in the on-state. The on-state of the heterojunction diode 41 is obtained in a manner per se known with a relatively low potential difference between the anode 23 and the cathode 21 (for example, a threshold voltage of approximately 0.5 V), allowing the potential drop and losses to be limited in this diode 41 in the on-state.

A PIN diode 42 is formed between the anode 23 and the cathode 21 and has an identical structure to that described with reference to FIG. 1. The potential difference to be applied between the cathode 21 and the anode 23 is greater than the threshold voltage of the heterojunction diode 41. Thus, as with the first embodiment, during a transient current surge, the PIN diode 42 that is formed provides a second conduction channel physically separated from that of the heterojunction diode 41. The diode structure 1 that is thus formed consequently allows a transient surge current to be obtained that is significantly greater than the nominal current of the heterojunction diode 41.

Circuits, not shown, selectively apply electric biasing to the cathodes 21, 22 and to the cathode 23.

The width of the contact 234 is designed in a manner per se known to allow passage of the nominal current of the diode 41 in the on-state.

FIGS. 4 to 13 are section views of various steps of an example of a method for manufacturing a diode structure 1 according to the first embodiment.

Figure 4:
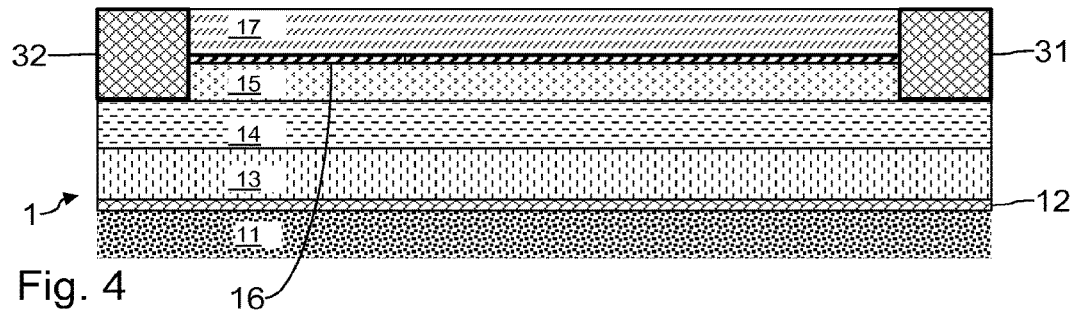
FIGS. 4 to 13 are section views of various steps of a method for manufacturing a diode structure according to the first embodiment.

In FIG. 4, a wafer is supplied comprising a substrate 11, overlaid with an adaptation layer 12, overlaid with a semi-conductive buffer layer 13, overlaid with a reduced-doped semi-conductive layer 14 made of III-N material, overlaid with a semi-conductive layer 15 made of III-N material, overlaid with a semi-conductive layer 17 made of III-N material in order to form, in a manner per se known, an electron gas layer 16 at the interface between these layers 15 and 17. The layers 11 to 17 can have a composition and dimensions as previously described. The semi-conductor elements 31 and 32 are arranged at a distance from each other. The semi-conductor elements 31 and 32 each extend depthwise from the surface of the layer 17 up to contact with the layer 14. The semi-conductor elements 31 and 32 are in lateral contact with the layers 15 and 17 and with the electron gas layer 16.

The semi-conductor elements 31 and 32 can be produced, for example, by implanting N-dopant in the layers 15 and 17, by silicon implantation, for example. The implantation of the silicon can be followed by a step of dopant activation annealing, in a manner per se known. The semi-conductor elements 31 and 32 also can be produced by etching, then depositing a layer of polysilicon, with N-doping. The semi-conductor elements 31 and 32 also can be produced following a step of epitaxy growth of an N-doped semi-conductor on the layer 14.

Figure 5:
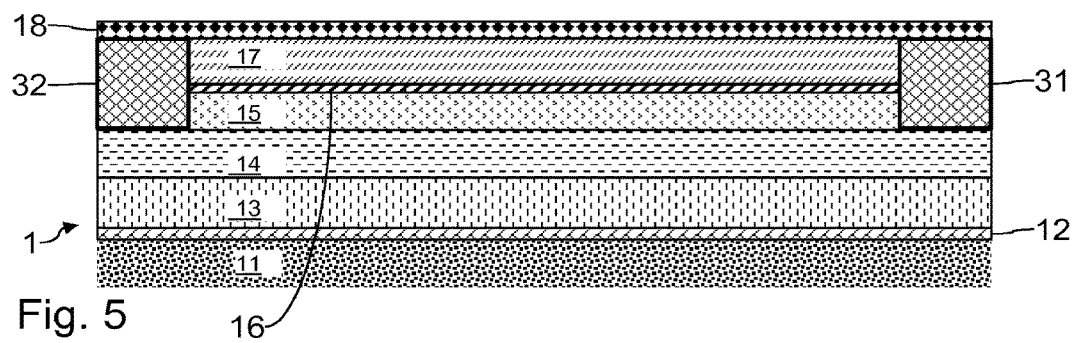

FIG. 5 shows the formation of a full slice passivation layer 18. This formation is produced, for example, by full slice deposition of an insulating layer such as SiN. The aforementioned step of activation annealing advantageously will be carried out following the formation of the passivation layer 18.

Figure 6:
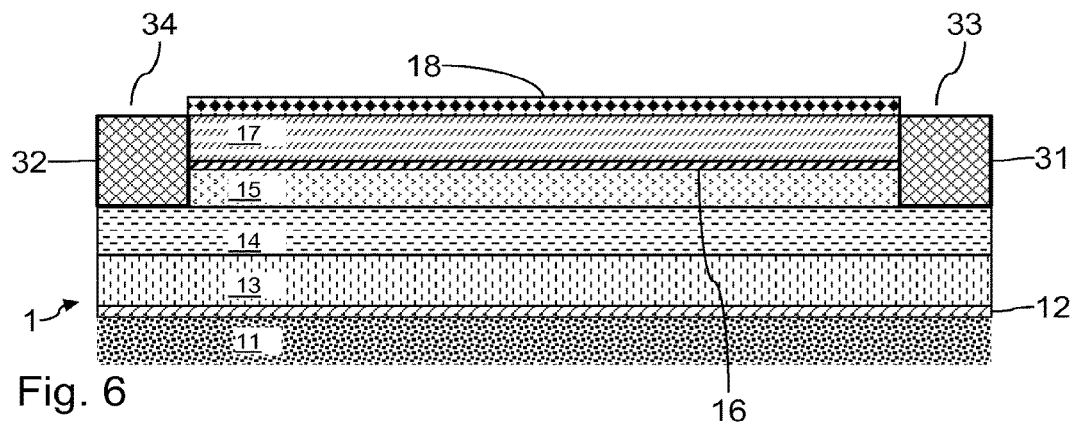

FIG. 6 shows the removal of the passivation layer 18 directly above the semi-conductor elements 31 and 32, so as to arrange clear zones 33 and 34 granting access to the upper faces of the semi-conductor elements 31 and 32, respectively. In order to form cathodes 21 and 22 overlapping the layer 17, as previously described, the removal of the passivation layer 18 can laterally exceed the semi-conductor elements 31 and 32. The zones 33 and 34 are, for example, formed by steps of photolithography, then of etching the passivation layer 18 to clear access to the upper faces of the semi-conductor elements 31 and 32, then of removing the photolithography mask.

Figure 7:
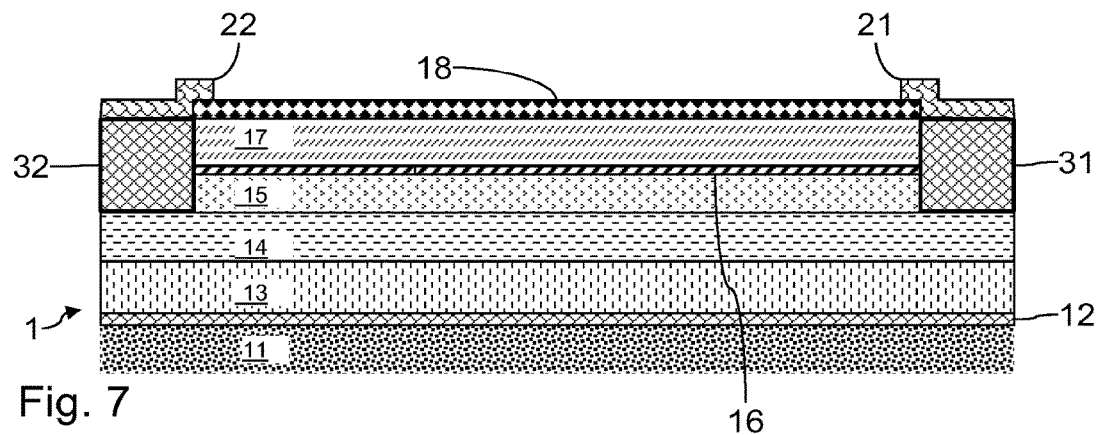

FIG. 7 shows the formation of the cathodes 21 and 22 in ohmic contact with the semi-conductor elements 31 and 32, respectively. The cathodes 21 and 22 in this case comprise, in a manner per se known, an overlap on the passivation layer 18. The cathodes 21 and 22 remain electrically insulated by means of the passivation layer 18. The formation of the cathodes 21 and 22 comprises, for example, a step of full slice metal deposition, followed by a step of photolithography, followed by a step of etching the pattern of the cathodes 21 and 22, followed by a step of removing the photolithography mask.

Figure 8:
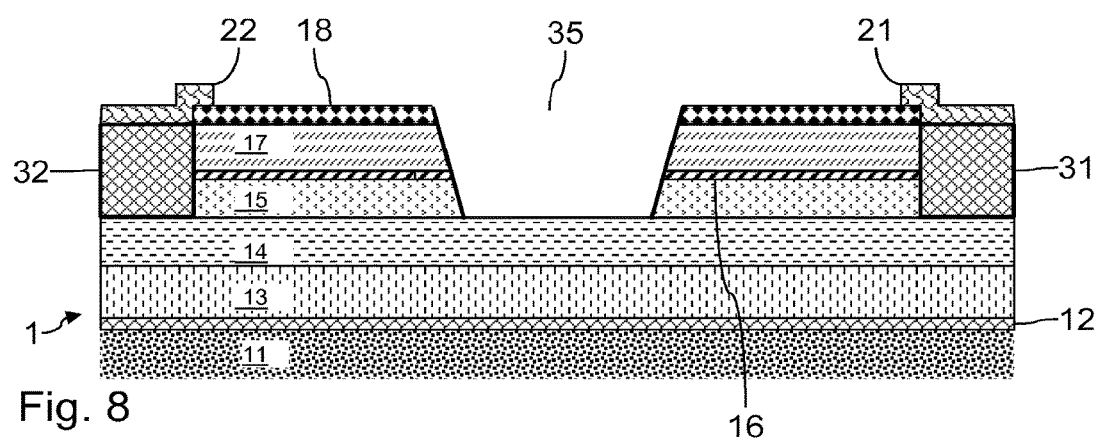

FIG. 8 shows the formation of a channel 35 between the cathodes 21 and 22, at a distance from the cathodes 21 and 22. The channel 35 is formed through the layers 18, 17 and 15 until the layer 14 is revealed. The formation of the channel 35 comprises, for example, a step of photolithography, followed by etching of the channel 35, followed by the removal of the photolithography mask. The channel 35 advantageously has lateral walls that are inclined relative to the vertical.

Figure 9:
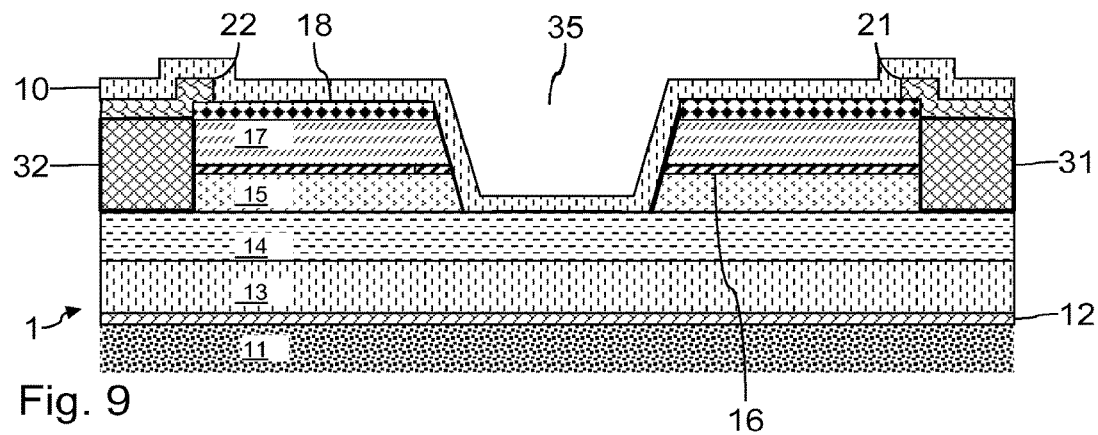

FIG. 9 shows the full slice formation of a layer 10 of a III-N type P-doped semi-conductor material. The formation of the layer 10 is carried out, for example, by epitaxy growth, for example, by epitaxy growth of a P-doped GaN. Magnesium particularly can be used as P-dopant.

Figure 10:
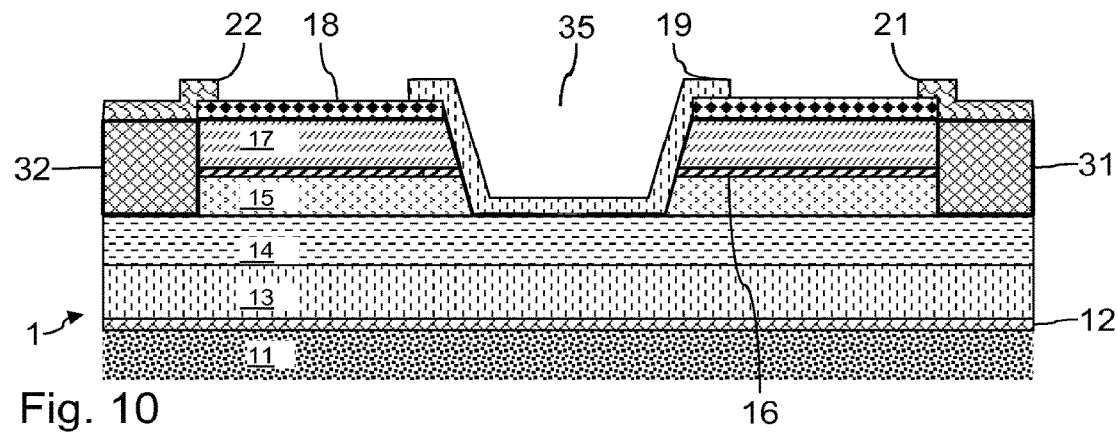

FIG. 10 shows the shaping of the P-doped semi-conductor element 19. The shaping of the element 19 can, for example, comprise a step of photolithography, followed by etching of the element 19, followed by the removal of the photolithography mask. In the configuration shown, the element 19 comprises lateral parts overhanging respective edges of the passivation layer 18.

Figure 11:
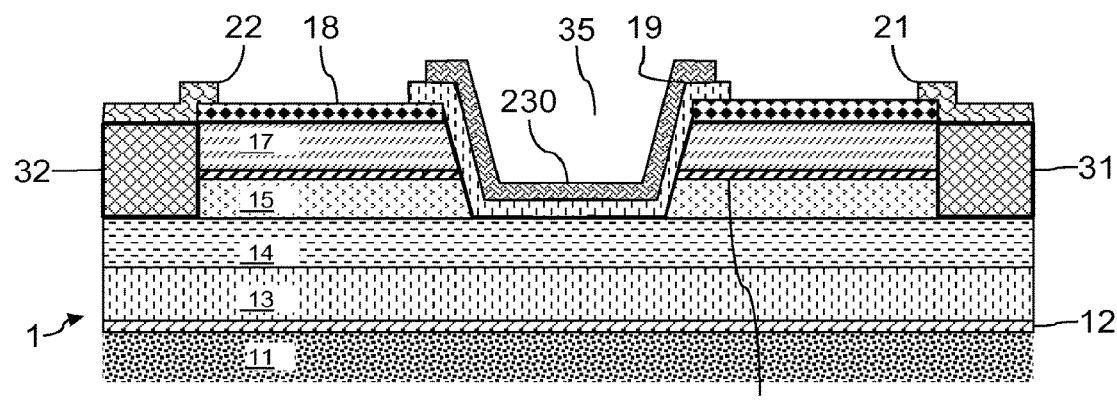

FIG. 11 shows the formation of a central portion 230 of the anode. To this end, a metal layer is deposited that is configured to form an ohmic contact with the semi-conductor element 19. This deposition typically is carried out with a full slice, followed by a step of photolithography and of etching to define the shape of the central portion 230. The deposit therefore is only maintained on the channel 35 to obtain a central portion 230 covering the main part of the element 19, but the deposit is removed elsewhere, particularly to reveal the layer 18.

Figure 12:
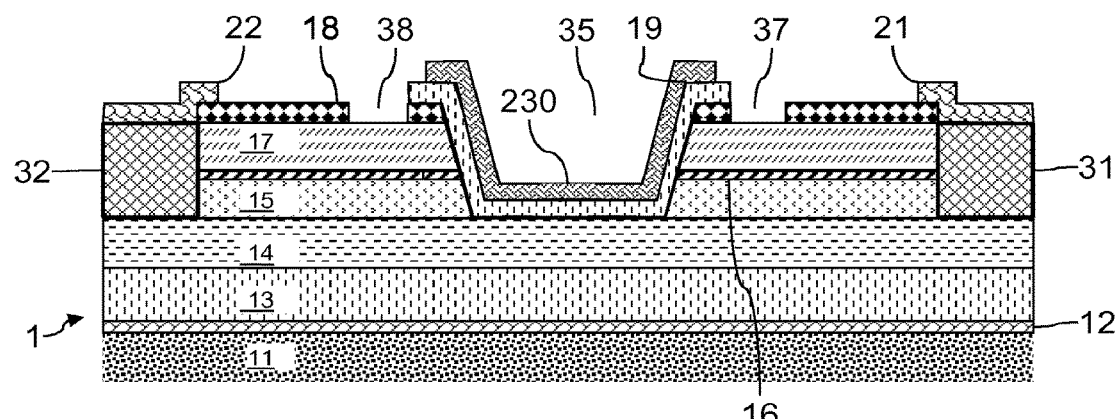

FIG. 12 shows the formation of the openings 37 and 38 through the passivation layer 18 until the layer 17 is revealed through these openings 37 and 38. The openings 37 and 38 are arranged between the element 19 and the cathodes 21 and 22, respectively. In this case, the openings 37 and 38 are adjoined to the element 19. Part of the passivation layer 18 is preserved under the lateral parts of the element 19. The formation of the openings 37 and 38 comprises, for example, a step of photolithography, followed by etching of the passivation layer 18 until a portion of the layer 17 is revealed, followed by the removal of the photolithography mask.

Figure 13:
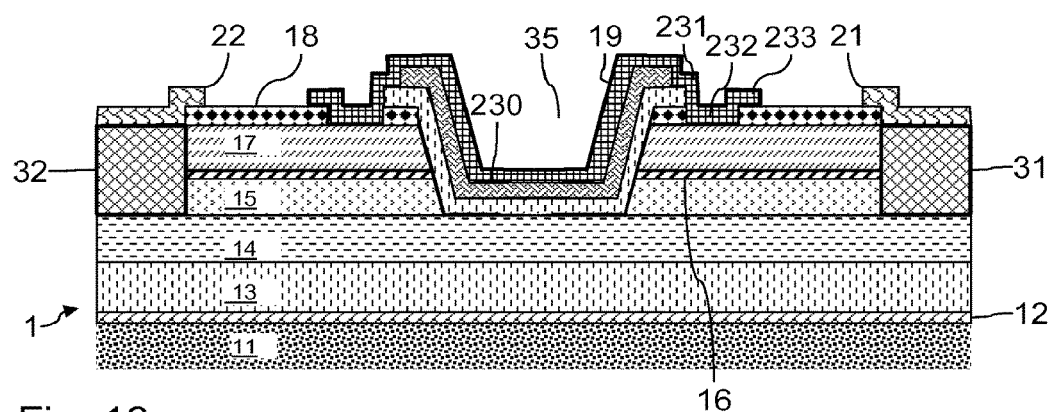

FIG. 13 shows the formation of the projecting portions 231 of the anode 23. The projecting portions 231 in this case are formed as one-piece with a metal deposit covering the central portion 230. Electric contact is thus formed between the projecting portions 231 and the central portion 230. The projecting portions 231 are laterally projecting toward the cathodes 21 and 22, respectively. The projecting portions 231 each comprise a Schottky contact 232 in contact with the layer 17 through the openings 37 and 38. The projecting portions 231 in this case comprise an overlap 233 beyond the Schottky contacts 232, above the passivation layer 18. An MIS type electrode is thus formed by this overlap 233 above the passivation layer 18. Of course, the anode 23 remains insulated from the cathodes 21 and 22 by means of the passivation layer 18. The material for forming a Schottky contact 232 can be selected as previously described.

The formation of the projecting portions 231 is carried out, for example, by full slice deposition of a metal forming a Schottky contact with the layer 17, followed by photolithography and etching of the metal deposit around the anode 23, followed by the removal of the photolithography mask.

Figure 14:
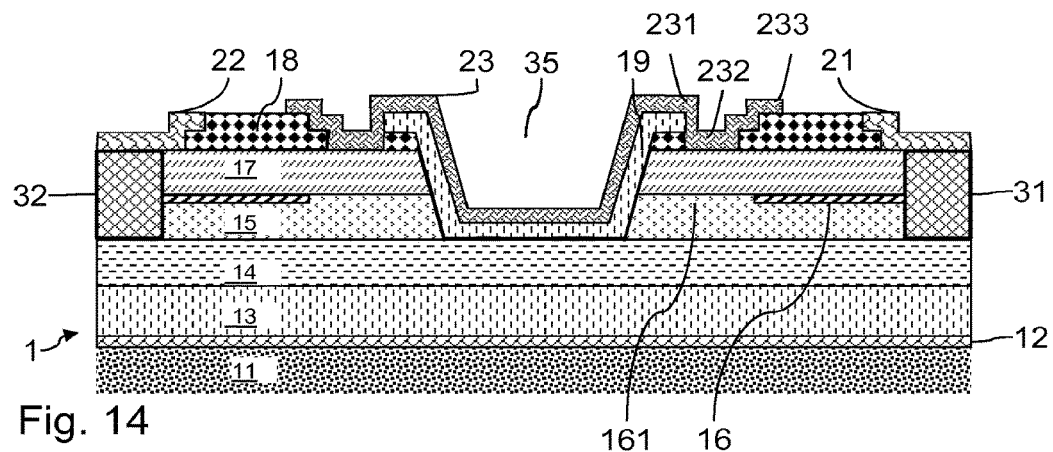
FIG. 14 is a section view of a variation of a diode structure according to the first embodiment.

By way of a variation of this manufacturing method, a passivation layer 18 can be produced with a stepped zone covered by an overlap 233 of the projecting portion 231 of the anode 23, as shown in FIG. 14.

Figure 15:
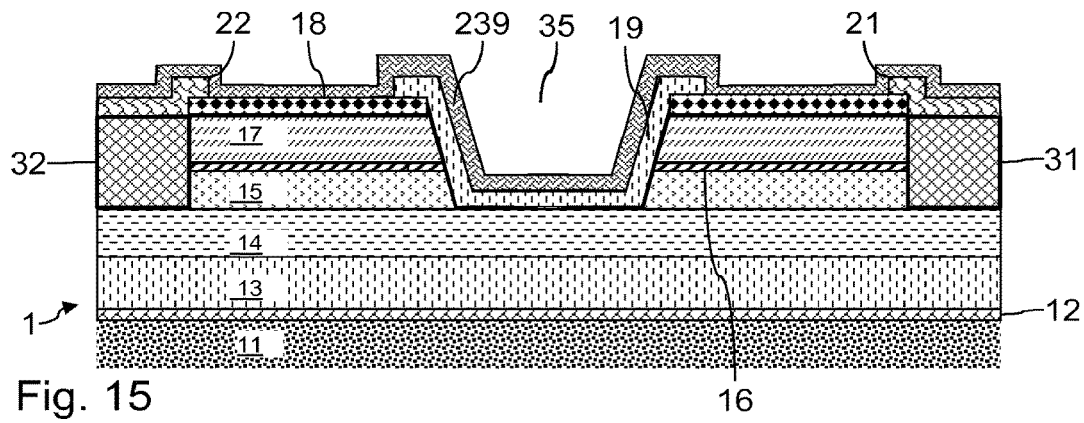
FIGS. 15 and 16 are section views of variations of steps of a manufacturing method.
Figure 16:
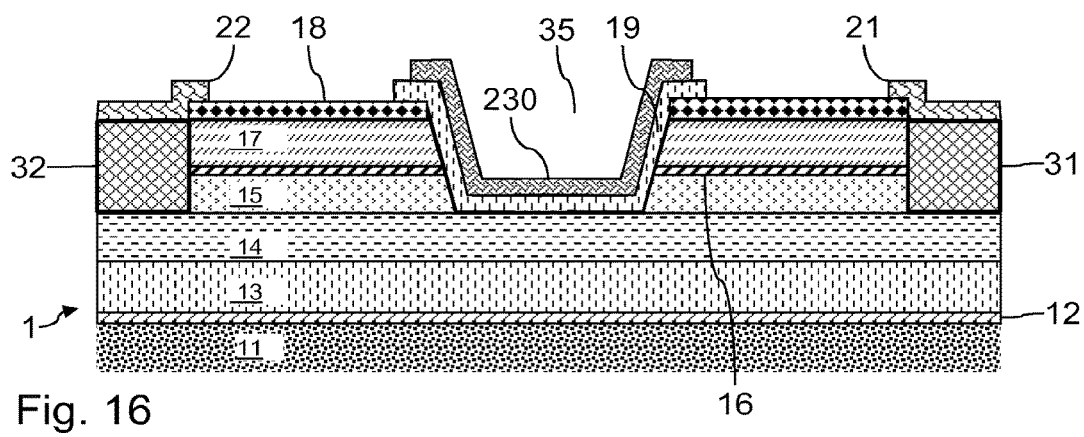

FIGS. 15 and 16 show a variation of the previously described manufacturing method. This variation of the manufacturing method is implemented on the basis of the step shown in FIG. 10. On completion of the step of FIG. 10, the semi-conductor element 19 that is formed is made of polysilicon or amorphous silicon. FIG. 15 shows the full slice deposition of a layer 239 of Ni+TiN.

FIG. 16 shows $N_2$ annealing so as to cause the Ni of the layer 239 to react with the silicon of the semi-conductor element 19. In line with the element 19, the layer 239 is converted to NiSi. The remainder of the layer 239 that has not reacted (and in particular the entire part of the layer 139 that does not cover the element 19) was then selectively withdrawn by wet processing, for example.

Advantageously, the passivation layer 18 can include a plurality of superposed layers made of different materials, for example, a superposition of layers of $SiN/SiO_2$. Through selective etching, the various layers of the passivation layer 18 can be successively opened, to form a step-shape as previously described. A single metallization then can be produced to form the contact 232 and the extensions 233.

Figure 17:
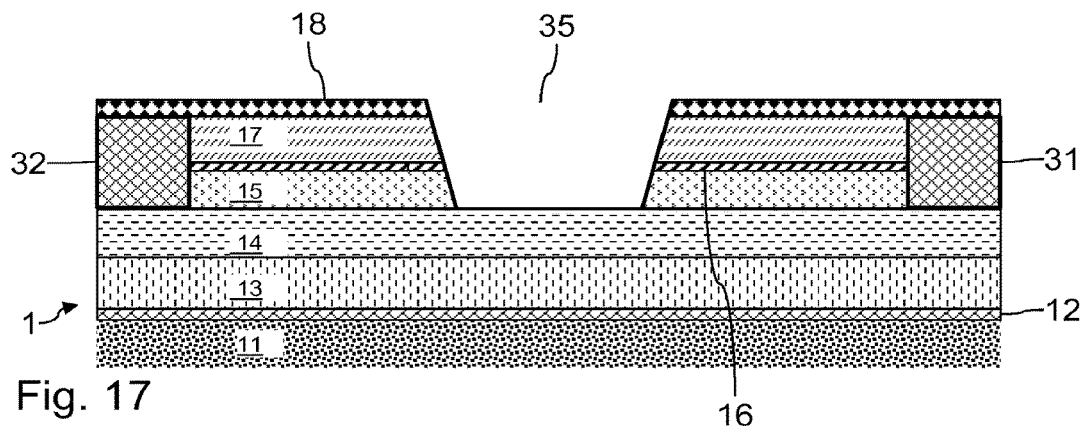
FIGS. 17 to 21 are section views of various steps of a variation of a method for manufacturing a diode structure.

The method described with reference to FIGS. 4 to 13 also can be modified as follows. In this case, the steps implemented with reference to FIGS. 4 and 5 can be reproduced. A channel 35 is then formed between the cathodes 21 and 22, at a distance from the cathodes 21 and 22, as shown in FIG. 17. The channel 35 is formed through the layers 18, 17 and 15 until the layer 14 is revealed. The formation of the channel 35 comprises, for example, a step of photolithography, followed by etching of the channel 35, followed by the removal of the photolithography mask. The channel 35 advantageously has lateral walls inclined relative to the vertical.

Figure 18:
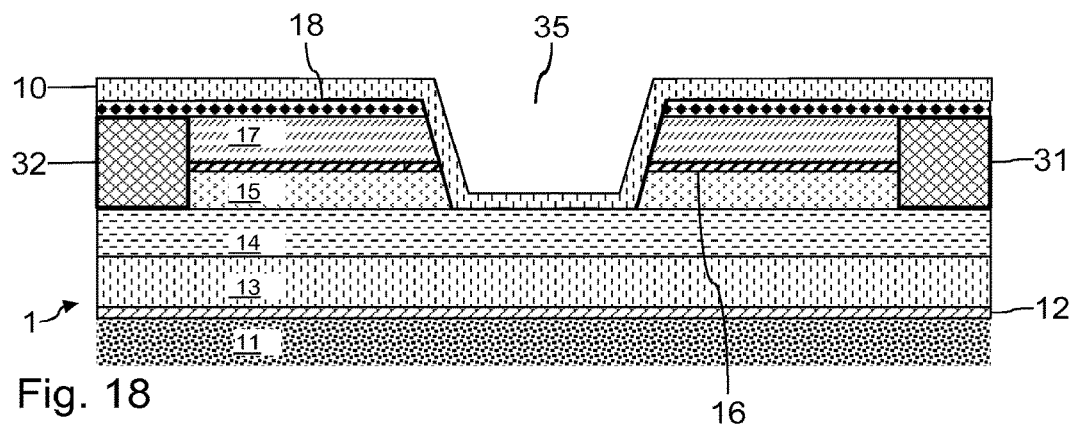

FIG. 18 shows the full slice formation of a layer 10 of a III-N type P-doped semi-conductor material. The formation of the layer 10 is carried out, for example, by epitaxy growth, for example, by epitaxy growth of a P-doped GaN. Magnesium particularly can be used as P-type dopant.

Figure 19:
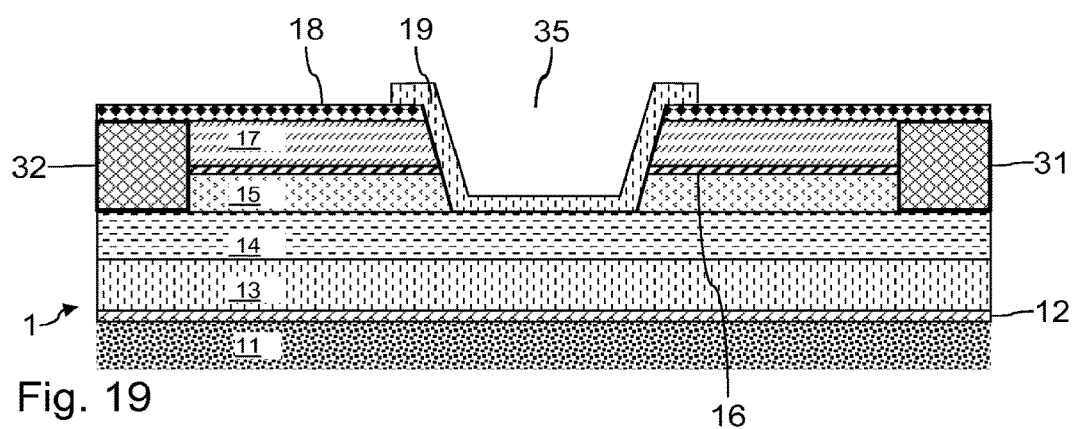

FIG. 19 shows the shaping of the P-doped semi-conductor element 19. The shaping of the element 19 can comprise, for example, a step of photolithography, followed by etching of the element 19, followed by the removal of the photolithography mask. In the configuration shown, the element 19 comprises lateral parts overhanging respective edges of the passivation layer 18.

Figure 20:
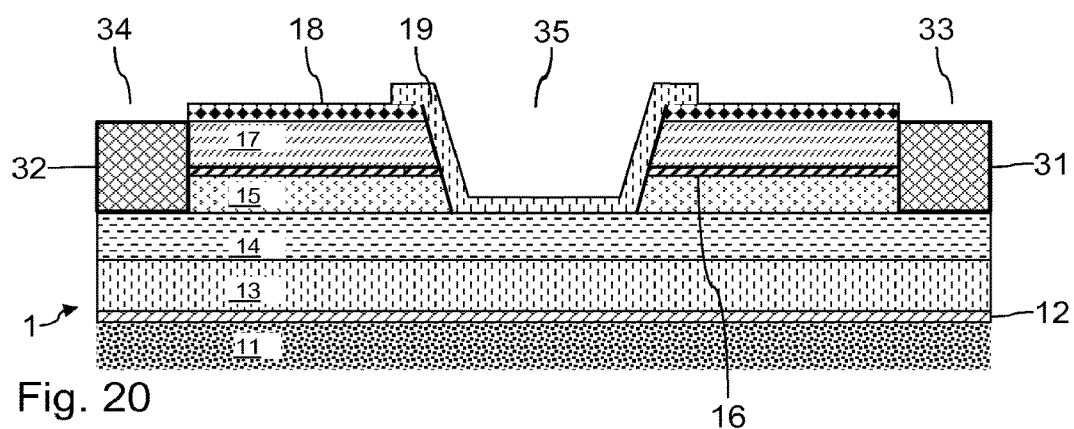

FIG. 20 shows the removal of the passivation layer 18 directly above the semi-conductor elements 31 and 32, so as to arrange clear zones 33 and 34 granting access to the upper faces of the semi-conductor elements 31 and 32, respectively.

In order to form cathodes 21 and 22 overlapping on the layer 17, as previously described, the removal of the passivation layer 18 can laterally exceed the semi-conductor elements 31 and 32. The zones 33 and 34 are formed, for example, by steps of photolithography, then of etching the passivation layer 18 to clear access to the upper faces of the semi-conductor elements 31 and 32, then of removing the photolithography mask.

Figure 21:
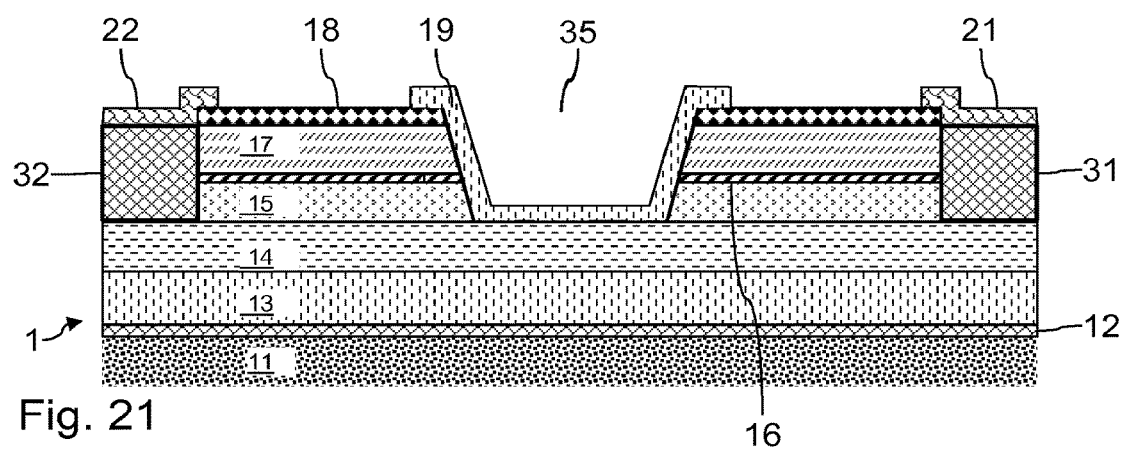

FIG. 21 shows the formation of the cathodes 21 and 22 in ohmic contact with the semi-conductor elements 31 and 32, respectively. The cathodes 21 and 22 in this case comprise, in a manner per se known, an overlap on the passivation layer 18. The cathodes 21 and 22 remain electrically insulated by means of the passivation layer 18. The formation of the cathodes 21 and 22 comprises, for example, a step of full slice metal deposition, followed by a step of photolithography, followed by a step of etching the pattern of the cathodes 21 and 22, followed by a step of removing the photolithography mask.

The method can be continued as described with reference to FIGS. 11 to 14.

In the examples shown, the layers 15 and 17 are in direct contact in order to form an electron gas layer 16 at their interface. In a manner per se known, an intermediate layer also can be interposed, for example, an AlN layer when the layer 15 is made of GaN and the layer 17 is made of AlGaN. Such an AlN layer typically is 1 nm thick.

The invention claimed is:

1. A heterojunction diode, comprising:
   first and second semi-conductive layers made of III-N material that are superposed to form an electron gas layer, the first semi-conductive layer being made of GaN;
   an anode and a cathode selectively electrically connected to each other by the electron gas layer;
   a third semi-conductive layer made of GaN, disposed under the electron gas layer, with N-doping having a concentration that is at most equal to $4*10^{16}$ cm$^{-3}$, the first semi-conductive layer being in contact with the third semi-conductive layer, the first and third semi-conductive layers being formed of a same III-N alloy with different doping, the first semi-conductive layer being of an unintentionally doped type;
   a first P-doped semi-conductor element in contact with the anode and with the third semi-conductive layer and forming a separation between the anode and the third semi-conductive layer; and
   a second N-doped semi-conductor element in contact with the cathode and with the third semi-conductive layer and forming a separation between the cathode and the third semi-conductive layer, the third semi-conductive layer and the first and second semi-conductor elements forming a PIN diode.

2. The heterojunction diode according to claim 1, wherein a concentration of dopants in the third semi-conductive layer is:
   less than a concentration of dopants in the first P-doped semi-conductor element, and
   less than a concentration of dopants in the second N-doped semi-conductor element.

3. The heterojunction diode according to claim 1, wherein the third semi-conductive layer is made of GaN with N-doping having a concentration that is at least equal to $5*10^{15}$ cm$^{-3}$.

4. The heterojunction diode according to claim 1, wherein the first P-doped semi-conductor element is made of P-doped GaN, P-doped AlGaN, or P-doped polysilicon.

5. The heterojunction diode according to claim 4, wherein a concentration of P-dopants in the first P-doped semi-conductor element is included in a range of $5*10^{17}$ cm$^{-3}$ and $10^{20}$ cm$^{-3}$.

6. The heterojunction diode according to claim 1, wherein the second N-doped semi-conductor element is made of N-doped GaN, N-doped AlGaN, or N-doped polysilicon.

7. The heterojunction diode according to claim 6, wherein a concentration of N-dopants in the second N-doped semi-conductor element is included in a range of $5*10^{17}$ cm$^{-3}$ and $10^{19}$ cm$^{-3}$.

8. The heterojunction diode according to claim 1, wherein the second semi-conductive layer is made of AlGaN.

9. The heterojunction diode according to claim 1, further comprising a channel, which passes through the first and second semi-conductive layers, and a bottom of which is delimited by the third semi-conductive layer, the first P-doped semi-conductor element being in contact with the third semi-conductive layer at the bottom of the channel.

10. The heterojunction diode according to claim 1, wherein the anode has a portion projecting laterally relative to the first P-doped semi-conductor element toward the cathode, the projecting portion being in contact with the second semi-conductive layer.

11. The heterojunction diode according to claim 10, wherein the projecting portion of the anode forms a Schottky contact with the second semi-conductive layer.

12. The heterojunction diode according to claim 10, wherein the projecting portion of the anode forms an ohmic or Schottky contact with the second semi-conductive layer and has an extension beyond said contact toward the cathode, a third P-doped semi-conductor element being positioned between said contact and the cathode, the third P-doped semi-conductor element being overhung by the extension of the anode and being in contact with the second semi-conductive layer.

13. A method for manufacturing a heterojunction diode, comprising:
   supplying first and second semi-conductive layers made of III-N material superposed to form an electron gas layer, the first semi-conductive layer being made of GaN of an unintentionally doped type, and a third semi-conductive layer made of GaN, disposed under the electron gas layer and with N-doping having a concentration that is at most equal to $4*10^{16}$ cm$^{-3}$, the first semi-conductive layer being in contact with the third semi-conductive layer, the first and third semi-conductive layers being formed of a same III-N alloy with different doping;
   forming a first P-doped semi-conductor element in contact with the third semi-conductive layer;
   forming a second N-doped semi-conductor element in contact with the third semi-conductive layer, the third semi-conductive layer and the first and second semi-conductor elements forming a PIN diode;
   forming an anode on the first P-doped semi-conductor element, so as to be separated from the third semi-conductive layer; and
   forming a cathode on the second N-doped semi-conductor element, so as to be separated from the third semi-conductive layer.

* * * * *